United States Patent [19]

Hjipieris et al.

[11] Patent Number: 5,237,291

[45] Date of Patent: Aug. 17, 1993

[54] MICROWAVE FREQUENCY SYNTHESIZER HAVING SELECTABLE OSCILLATOR SOURCES AND OUTPUT POWER CONTROL

[75] Inventors: George Hjipieris; Guy Purchon; Alan M. Elston, all of Hitchin; Garry Thorp, Stevenage, all of England

[73] Assignee: Marconi Instruments Limited, England

[21] Appl. No.: 899,480

[22] Filed: Jun. 16, 1992

[30] Foreign Application Priority Data

Jun. 19, 1991 [GB] United Kingdom ................. 9113234

[51] Int. Cl.$^5$ ...................... H03B 21/01; H03L 7/07; H03L 7/23
[52] U.S. Cl. ......................................... 331/2; 331/40; 331/49; 331/179; 331/183
[58] Field of Search ....................... 331/2, 49, 183, 37, 331/40, 179

[56] References Cited

U.S. PATENT DOCUMENTS 4,307,348 12/1981 Nicholson ........................... 330/134
4,322,692 3/1982 Brewerton et al. ...................... 331/2
4,516,085 5/1985 Effinger et al. ................... 331/49 X

FOREIGN PATENT DOCUMENTS 2045556 10/1980 United Kingdom .
2113493 8/1983 United Kingdom .

Primary Examiner—Siegfried H. Grimm
Attorney, Agent, or Firm—Kirschstein, Ottinger, Israel & Schiffmiller

[57] ABSTRACT

A microwave synthesiser comprising: a plurality of oscillator sources (1, 13, 3, 15, 5, 17, 7), each for generating signals over a range of frequencies, said ranges of frequencies together extending over a total range of frequencies generated; phase locked loops (19, 31, 83, 37, 38, 41, 81) for phase-locking any selected one of said oscillator sources (1, 13, 3, 15, 5, 17, 7) so that it generates signals of a frequency at which it is set; a single low harmonic modulator (21) for modulating the signals generated by the selected one of said oscillator sources (1, 13, 3, 15, 5, 17, 7), the modulated signals passing to an output (27) of said synthesiser; and at said output (27) elements (25, 29) for detecting the power of the signals at said output (27), the modulation by said single low harmonic modulator (21) being controlled in dependence on the detected power thereby to control the power of the signals at said output (27).

12 Claims, 2 Drawing Sheets

MICROWAVE FREQUENCY SYNTHESIZER HAVING SELECTABLE OSCILLATOR SOURCES AND OUTPUT POWER CONTROL

This invention relates to microwave synthesisers.

More particularly the invention relates to microwave synthesisers comprising: a plurality of oscillator sources, each for generating signals over a range of frequencies, the ranges of frequencies together extending over a total range of frequencies generated; means for phase-locking any selected one of the oscillator sources so that it generates signals of a frequency at which it is set; means for modulating the signals generated by the selected one of the oscillator sources, the modulated signals passing to an output of the synthesiser; and at the output means for detecting the power of the signals at the output, the modulation by the means for modulating being controlled in dependence on the detected power thereby to control the power of the signals at the output.

Known microwave synthesisers of the above kind are complex in design and slow in operation. As a consequence of being complex in design they are large in size, heavy in weight, and expensive in cost, and thus unsuited to a number of modern applications of the synthesiser.

It is an object of the present invention to provide a microwave synthesiser wherein the above problems are overcome.

According to the present invention there is provided a microwave synthesiser comprising: a plurality of oscillator sources, each for generating signals over a range of frequencies, said ranges of frequencies together extending over a total range of frequencies generated; means for phase-locking any selected one of said oscillator sources so that it generates signals of a frequency at which it is set; a single low harmonic modulator for modulating the signals generated by the selected one of said oscillator sources, the modulated signals passing to an output of said synthesiser; and at said output means for detecting the power of the signals at said output, the modulation by said single low harmonic modulator being controlled in dependence on the detected power thereby to control the power of the signals at said output.

The use of a single low harmonic modulator operative over the whole of the total range of frequencies generated simplifies the design of the synthesiser. Particularly, it replaces many of the large number of relatively narrow band modulators and their associated filters of the aforementioned known microwave synthesisers.

Preferably, the synthesiser further comprises: a further oscillator source for generating signals over a range of frequencies, which range together with said total range extends over an entire range of frequencies generated; and a further low harmonic modulator for modulating the signals generated by said further source, which modulated signals pass to said output of said synthesiser, the modulation by said further low harmonic modulator being controlled in dependence on the power detected at said output by said means for detecting thereby to control the power of the signals at said output.

Preferably, said means for detecting comprises: a resistive pick-off at said output of the synthesiser; and connected to said pick-off an output power levelling detector, said means for detecting being used in controlling the power of the signal at said output over the whole of the range of frequencies passed to said output.

Such use of a resistive pick-off improves the match of the synthesiser to the device it is applying signals to. The aforementioned known microwave synthesisers utilise directional couplers in controlling the power level of the output of the synthesiser. Such use significantly limits the match of the synthesiser to the device it is applying signals to. Further, the known synthesisers utilise two power levelling detectors in controlling the power level of the output of the synthesiser, which power levelling detectors have different temperature coefficients. This results in a step change in the level of the output power of the synthesiser when the synthesiser is sweeping the frequencies applied thereby. The preferred use of a single power levelling detector in the present invention overcomes this problem.

A microwave synthesiser in accordance with the present invention will now be described, by way of example, with reference to the accompanying drawings, in which.

Figure 1:
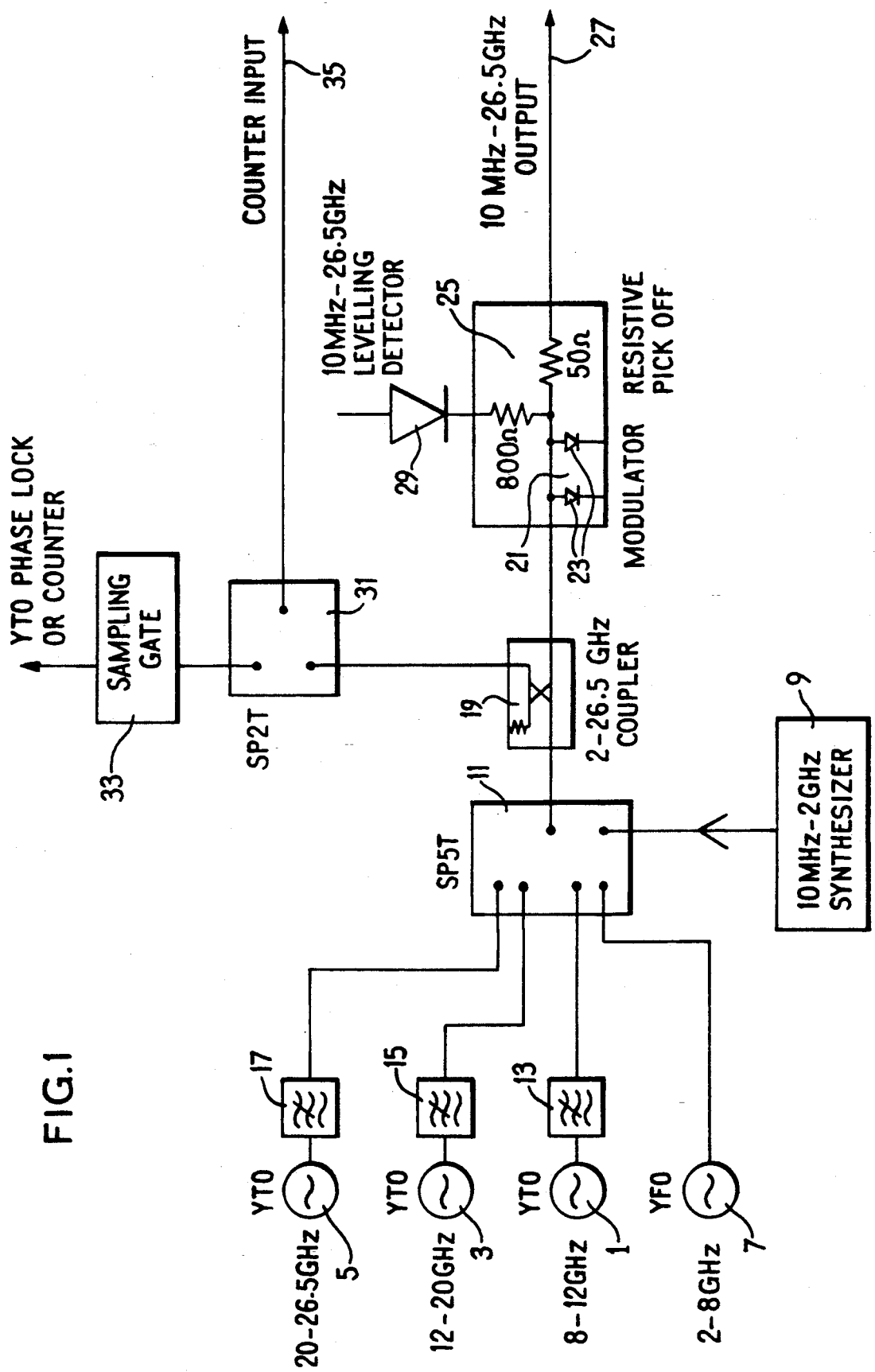
FIG. 1 is a schematic circuit diagram of a main part of the synthesiser.

Referring to FIG. 1, the synthesiser comprises three yig (yttrium iron garnet) tuned oscillators (YTOs) 1, 3, 5 for generating signals in the frequency ranges 8-12, 12-20, and 20-26.5 GHz respectively, and a YTO with an integrated tracking filter (YFO) 7 for generating signals in the frequency range 2-8 GHz. The synthesiser further comprises a subsidiary synthesiser 9 for generating signals in the 0.01-2 GHz range.

The signals generated by the three YTOs 1, 3, 5, the YFO 7 and the sand the subsidiary synthesiser 9 are fed to a five-way switch 11. The signals from the three YTOs 1, 3, 5 are fed to the switch 11 via respective lowpass filters 13, 15, 17 which reduce unwanted harmonic frequencies generated by the YTOs 1, 3, 5. No corresponding lowpass filter (in fact a bank of switched filters would be used) is required in respect of the YFO 7 since it includes the integrated tracking filter.

A single output from the switch 11 is fed via a 2-26.5 GHz directional coupler 19 to a 2-26.5 GHz low harmonic modulator/variable attenuator 21 comprising long carrier lifetime PIN diodes 23 having thick intrinsic regions. These particular diodes 23 ensure that harmonic generation by the modulator 21 is low by reducing the effect of the radio frequency signal received from the switch 11 on the d.c. charge stored in the intrinsic regions of the diodes 23. In this connection it is to be noted that in a diode modulator in receipt of a radio frequency signal as the modulator 21, harmonics are caused by variations in the impedances of the diodes during the periods of the cycles of the radio frequency signal. These variations occur when the ratio of the radio frequency to d.c. charge stored in the intrinsic regions of the diodes 23 is high. At lower frequency radio frequency signals the problem of harmonic generation is accentuated due to the increased length of the radio frequency signal cycle period which allows the radio frequency signal to have a greater effect on the stored charge. Thus for frequencies in the 0.01-2 GHz range, i.e. for signals from the subsidiary synthesiser 9, the diodes 23 of the modulator 21 are heavily reverse biassed to avoid harmonic generation. The modulator 21 provides a greater than 30 dB attenuation range for frequencies in the 2-26.5 GHz range, i.e. for signals from the YTOs 1, 3, 5 and the YFO 7, whilst behaving as a low loss throughline for frequencies in the 0.01-2 GHz range. The modulator 21 is operative to maintain at a constant level the power of signals in the frequency range 2-26.5 GHz output by the synthesiser. To this end the modulator 21 is driven by a signal derived from a later mentioned 0.01-26.5 GHz diode power levelling detector 29.

The directional coupler 19 divides off a fraction of the signal received from the switch 11 via a further switch 31 to a sampling gate 33. The output from the sampling gate 33 is used to phase lock the three YTOs 1, 3, 5 and the YFO 7, as will be explained below with reference to FIG. 2.

The further switch 31 has an additional input to that from the coupler 19 from a counter input 35 of the synthesiser. When the switch 31 is switched to the counter input 35, frequencies in the range 0.01-26.5 GHz input to the counter input 35 are fed via the sampling gate 33 for counting, as will be explained below with reference to FIG. 2.

Returning to the modulator 21, the output therefrom is fed via an 800 ohm resistive pick-off with a series 50 ohm resistor 25 to an output port 27 of the microwave synthesiser. The 800 ohm resistor of the resistive pick-off 25 is connected to a 0.01-26.5 GHz diode power levelling detector 29 for use in controlling the power of the 0.01-26.5GHz signals output from the output port 27. The detector 29 provides the aforementioned signal to the modulator 21 for use in controlling the power of signals in the frequency range 2-36.5 GHz output by the synthesiser. The detector 29 also provides a signal to a later mentioned 0.01-2 GHz modulator 47 for use in controlling the power of signals in the frequency range 0.01-2 GHz output by the synthesiser.

Figure 2:
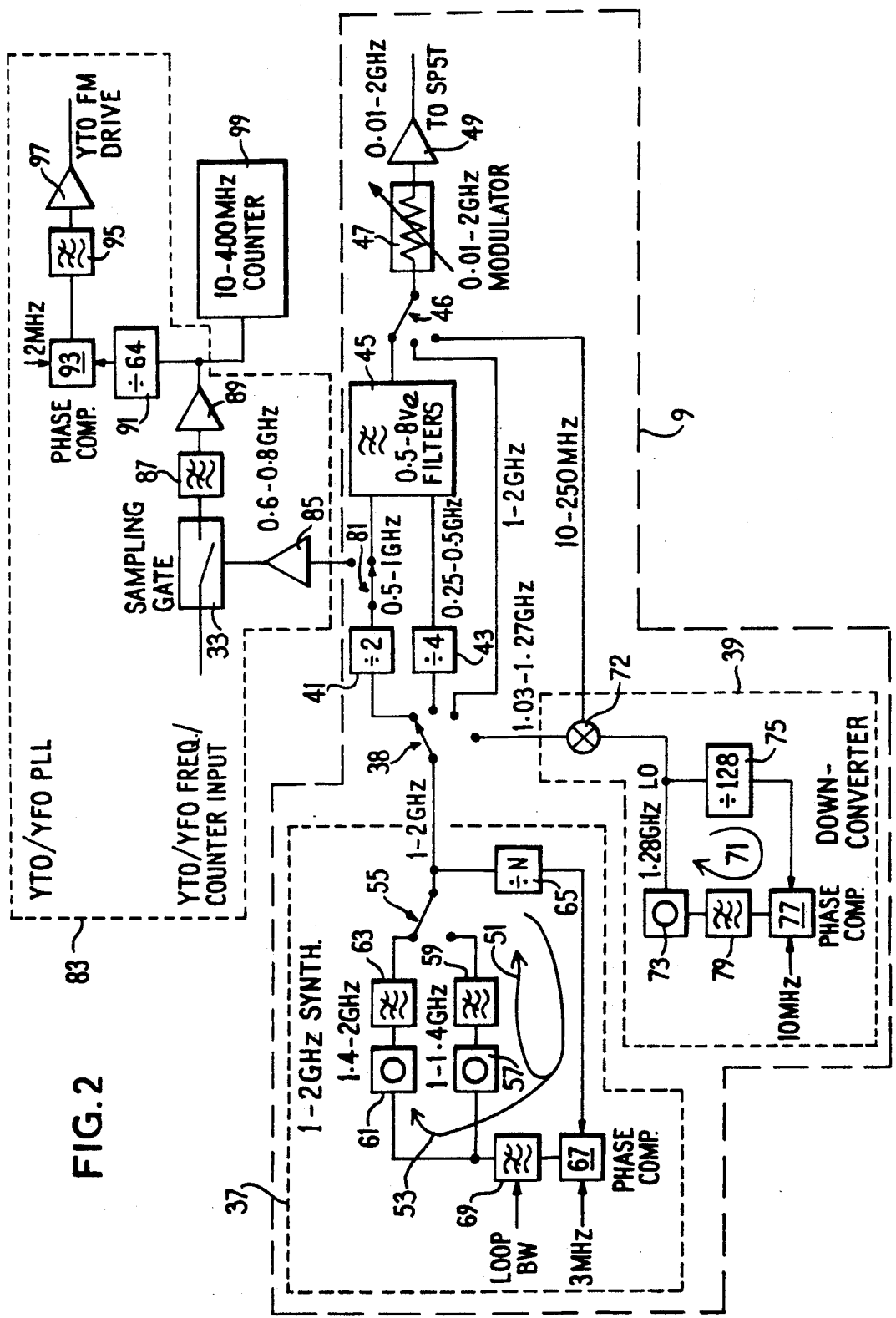
FIG. 2 is a schematic circuit diagram of the remainder of the synthesiser.

Referring to FIG. 2, the 0.01-2 GHz synthesiser 9 comprises a 1-2 GHz synthesiser 37, a four-way switch 38, a heterodyne unit or down-converter 39 for generating frequencies in the range 0.01-0.25 GHz, dividers 41, 43, a bank of switched lowpass filters 45, a three-way switch 46, a 0.01-2 GHz low harmonic modulator 47, and an amplifier 49.

The 1-2 GHz synthesiser 37 comprises two phase-locked loops 51, 53 alternatively selectable by means of a switch 55. The loop 51 includes a 1-1.4 GHz half octave voltage controlled oscillator (VCO) 57 followed by a lowpass filter 59 for reducing unwanted harmonics. The loop 53 includes a 1.4-2 GHz half octave VCO 61 followed by a lowpass filter 63 for reducing unwanted harmonics. Common to both loops 51, 53 are a fractional-N programmable divider 65, a phase comparator 67 with a 0.003 GHz reference frequency, and a loop bandwidth setting filter 69.

Thus, in operation of the 1-2 GHz synthesiser 37, if it is required that the synthesiser 37 generate a frequency in the 1-1.4 GHz range, the loop 51 is selected by means of the switch 55 and divider 65 adjusted until the 1-1.4 GHz VCO 57 is oscillating at the required frequency. Similarly, if it is required that the synthesiser 37 generate frequency in the 1.4-2 GHz range, the loop 53 is selected by means of the switch 55 and the divider 65 adjusted until the 1.4-2 GHz VCO 61 is oscillating at the required frequency. In sweep mode of the microwave synthesiser, the loop 51, 53 bandwidth is set to about 100 kHz by means of the filter 69 to achieve fast locking. Alternatively, the loop 51, 53 bandwidth can be set to 3 kHz for low noise operation.

For the generation by the microwave synthesiser of frequencies in the range 1-2 GHz, the switches 38, 46 are set so that the 1-2 GHz synthesiser 37 is connected directly to the 0.01-2 GHz low harmonic modulator 47.

For the generation by the microwave synthesiser of frequencies in the range 0.5-1 GHZ, the frequencies generated by the 1-2 GHz synthesiser 37 are directed, by means of the setting of the switches 38, 46, so as to pass via the divide-by-two divider 41 to the modulator 47. Similarly, for the generation by the microwave synthesiser of frequencies in the range 0.25-0.5 GHz, the frequencies generated by the 1-2 GHz synthesiser 37 are directed, by means of the setting of the switches 38, 46, so as to pass via the divide-by-four divider 43 to the modulator 47. To reduce unwanted harmonics the signals output by the dividers 41, 43 are fed to the modulator 47 via the bank of switched lowpass filters 45.

For the generation by the microwave synthesiser of frequencies in the range 0.01-0.25 GHz, the switches 38, 46 are set so that frequencies generated by the 1-2 GHz synthesiser 37 are directed to the heterodyne unit 39, and frequencies output by the heterodyne unit 39 are fed directly to the modulator 47.

The heterodyne unit 39 comprises a phase-locked loop 71 and a mixer 72. The phase-locked loop 71 comprises a 1.28 GHz VCO 73, a divide-by-one hundred and twenty eight divider 75, a phase comparator 77 with a reference frequency of 0.01 GHz, and a loop bandwidth filter 79. Thus, in operation of the heterodyne unit 39, the mixer 72 mixes the 1.28 GHz frequency from the phase-locked loop 71 with frequencies in the range 1.03-1.27 GHz from the 1-2 GHz synthesiser 37. The frequencies within the range 0.01-0.25 GHz produced by the mixer 72 are passed to the modulator 47.

Thus, signals of frequencies within the range 0.01-2 GHz are input to the low harmonic modulator 47. These signals are low harmonic signals and are arranged to have a power level of about $-5$ dBm. It is necessary that the power level of the signals received by the modulator 47 be such a low value in order to reduce radio frequency (r.f.) biassing of the diodes comprising the modulator 47. Such reduction in the r.f. biassing of the diodes of the modulator 47 allows operation of the modulator 47 down to a frequency of 0.01 GHz without compromising the low harmonic performance of the modulator 47. The modulator 47 is operative to maintain at a constant level the power of signals in the frequency range 0.01-2 GHz output by the synthesiser. To this end the modulator 47, as the modulator 21, is driven by a signal derived from the 0.01-26.5 GHz diode power levelling detector 29.

Finally, prior to the 0.01-2 GHz signals passing from the synthesiser 9 to the five-way switch 11 of FIG. 1, the signals are amplified by the amplifier 49 to a power level of greater than 15 dBm. To ensure that harmonics after the amplifier 49 are kept less than $-30$ dBc, high power bipolar transistors are used in the amplifier 49 to keep the operation thereof well below compression.

When not providing frequencies for input to the switch 11 of FIG. 1, the 0.01-2 GHz synthesiser 9 serves to provide frequencies for phase-locking the three YTOs 1, 3, 5 and the YFO 7. In this mode of operation, the switch 38 is set as shown in FIG. 2, and a further switch 81 between the divider 41 and the filters 45 set to connect the output of the divider 41 to a YTO/YFO phase-locking loop (PLL) means 83 of the microwave synthesiser.

The YTO/YFO PLL means 83 comprises an amplifier 85, a sampling gate 33 (also shown in FIG. 1), a lowpass filter 87, a further amplifier 89, a divide-by-sixty four divider 91, a phase comparator 93 with a reference frequency of 0.002 GHz, a further lowpass filter 95, and a further amplifier 97.

In operation of the YTO/YFO PLL means 83, the frequency output by the divider 41 passes via the switch 81 to the amplifier 85, is amplified by the amplifier 85, and passes to the sampling gate 33. Thereat the frequency is mixed with the YTO/YFO frequency received by the sampling gate 33, via the two-way switch 31, from the directional coupler 19 (see FIG. 1). The resulting intermediate frequency (IF) produced at the output of the sampling gate 33 is then filtered by the lowpass filter 87 to remove spurii, amplified by amplifier 89, divided by sixty four by the divider 91 and applied to the phase comparator 93 operating at 0.002 GHz. The output of the phase comparator 93 is lowpass filtered by the filter 95, amplified by the amplifier 97, and used to drive the frequency modulation (FM) coils of the YTO 1, 3, 5 or the YFO 7. Thus, by appropriately setting the switch 55 and fractional-N programmable divider 65 of the 1-2 GHz synthesiser 37, the frequency output by the divider 41 can be set so as to produce, when mixed in the sampling gate 33 with the YTO/YFO frequency, the intermediate frequency necessary for phase-locking, by means of the divider 91 and phase comparator 93, the YTO 1, 3, 5 or YFO 7 at the required frequency of oscillation of the YTO 1, 3, 5 or YFO 7. Although, for this purpose frequencies in the range 0.5-1 GHz are available at the output of the divider 41, only frequencies in the range 0.6-0.8 GHz are actually required.

A 0.01-0.4 GHz counter 99 is also connected to the output of the amplifier 89. In use of the counter 99, a frequency in the range 0.01-26.5 GHz input to the counter input 35 of the microwave synthesiser passes via the two-way switch 31 to the sampling gate 33 (see FIG. 1) where it is mixed with the frequency output by the divider 41. The intermediate frequency produced is filtered by the filter 87, amplified by the amplifier 89, and passes to the counter 99. For input frequencies below 0.4 GHz direct counting is employed. For higher frequencies the switch 55 and divider 65 of the 1-2 GHz synthesiser 37 are set such that the IF produced by the sampling gate 33 is between 0.07 and 0.25 GHz. The input frequency is then computed from two counts.

We claim:

1. A microwave synthesiser comprising: a plurality of oscillator sources, each for generating signals over a range of frequencies, said ranges of frequencies together extending over a total range of frequencies generated; means for phase-locking any selected one of said oscillator sources so that it generates signals of a frequency at which it is set; a single low harmonic modulator for modulating the signals generated by the selected one of said oscillator sources, the modulated signals passing to an output of said synthesiser; and at said output means for detecting the power of the signals at said output, the modulation by said single low harmonic modulator being controlled in dependence on the detected power thereby to control the power of the signals at said output.

2. A synthesiser according to claim 1 wherein said plurality of oscillator sources comprises four oscillator sources which generate signals from 2-8 GHz, 8-12 GHz, 12-20 and 20-26.5 GHz respectively.

3. A synthesiser according to claim 2 wherein: each of said 8-12 GHz, 12-20 GHz, and 20-26.5 GHz oscillator sources comprises a yig (yttrium iron garnet) tuned oscillator (YTO) followed by a lowpass filter for reducing unwanted harmonic frequencies generated by the YTO; and said 2-8 GHz oscillator source comprises a YTO with an integrated tracking filter for reducing unwanted harmonic frequencies generated by the YTO.

4. A synthesiser according to claim 1 further comprising: a further oscillator source for generating signals over a range of frequencies, which range together with said total range extends over an entire range of frequencies generated; and a further low harmonic modulator for modulating the signals generated by said further source, which modulated signals pass to said output of said synthesiser, the modulation by said further low harmonic modulator being controlled in dependence on the power detected at said output by said means for detecting thereby to control the power of the signals at said output.

5. A synthesiser according to claim 4 wherein said further oscillator source generates signals from 0.01-2 GHz.

6. A synthesiser according to claim 5 wherein said 0.01-2 GHz further oscillator source comprises: a 1-2 GHz synthesiser comprising two alternatively selectable phase-locked loops, one of which includes a 1-1.4 GHz voltage controlled oscillator, the other of which includes a 1.4-2 GHz voltage controlled oscillator, said loops having a common fractional-N programmable divider; divide-by-two and divide-by-four dividers for receiving 1-2 GHz frequencies from said 1-2 GHz synthesiser and providing frequencies in the ranges 0.5-1 GHz and 0.25-0.5 GHz respectively; and a heterodyne unit for receiving 1.03-1.27 GHz frequencies from the 1-2 GHz synthesiser, mixing these frequencies with a frequency of 1.28 GHz produced by a 1.28 GHz voltage controlled oscillator of a phase-locked loop of said heterodyne unit, and providing frequencies in the range 0.01-0.25 GHz.

7. A synthesiser according to claim 4 further including a multi-way switch by means of which said plurality of oscillator sources and said further oscillator source are alternatively selectable.

8. A synthesiser according to claim 1 wherein said means for detecting comprises: a resistive pick-off at said output of the synthesiser; and connected to said pick-off an output power levelling detector, said means for detecting being used in controlling the power of the signal at said output over the whole of the range of frequencies passed to said output.

9. A synthesiser according to claim 1 wherein said means for phase-locking any selected one of said plurality of oscillator sources comprises: a single directional coupler for dividing-off a fraction of the signal generated by the selected oscillator source; and a sampling gate for mixing said fraction divided-off with any one of a range of mixing frequencies to produce a signal of an intermediate frequency, the intermediate frequency signal being utilised in phase-locking the selected oscillator source.

10. A synthesiser according to claim 5 wherein said means for phase-locking any selected one of said plurality of oscillator sources comprises: a single directional coupler for dividing-off a fraction of the signal generated by the selected oscillaor source; and a sampling gate for mixing said fraction divided-off with any one of a range of mixing frequencies to produce a signal of an intermediate frequency, the intermediate frequency signal being utilised in phase-locking the selected oscillator source.

11. A synthesiser according to claim 10 wherein said range of mixing frequencies is 0.6–0.8 GHz and is derived from said 0.01–2 GHz further oscillator source.

12. A synthesiser according to claim 9 wherein said directional coupler is connected to said sampling gate by way of a switch operable to connect a counter input of said synthesiser to said sampling gate instead of said coupler, said sampling gate mixing a signal applied to said counter input with any one of said range of mixing frequencies and the intermediate frequency signal produced being passed to a counter.

* * * * *